(12) United States Patent
Binns et al.

(10) Patent No.: US 10,153,143 B2
(45) Date of Patent: Dec. 11, 2018

(54) SMART CHAMBER AND SMART CHAMBER COMPONENTS

(71) Applicant: Applied Materials, Inc., Santa Clara, CA (US)

(72) Inventors: Simon Nicholas Binns, East Palo Alto, CA (US); Brian T. West, San Jose, CA (US); Ronald Vern Schauer, Gilroy, CA (US); Roger M. Johnson, Livermore, CA (US); Michael S. Cox, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 82 days.

(21) Appl. No.: 14/623,419

(22) Filed: Feb. 16, 2015

(65) Prior Publication Data
US 2015/0262798 A1   Sep. 17, 2015

Related U.S. Application Data

(60) Provisional application No. 61/954,458, filed on Mar. 17, 2014, provisional application No. 61/953,428, filed on Mar. 14, 2014.

(51) Int. Cl.
*H01J 37/34* (2006.01)
*H01J 37/32* (2006.01)

(52) U.S. Cl.
CPC .... *H01J 37/3476* (2013.01); *H01J 37/32935* (2013.01); *H01J 37/3405* (2013.01); *H01J 37/3414* (2013.01); *H01J 37/3479* (2013.01)

(58) Field of Classification Search
CPC ............. H01J 37/32935; H01J 37/3405; H01J 37/3414; H01J 37/3476; H01J 37/3479

USPC .......................... 204/192.13, 298.03, 298.09
See application file for complete search history.

(56) References Cited

U.S. PATENT DOCUMENTS

| | | | | |
|---|---|---|---|---|
| 4,204,936 A | * | 5/1980 | Hartsough | H01J 37/3405 204/192.12 |
| 4,407,708 A | * | 10/1983 | Landau | H01J 37/3405 204/192.13 |
| 5,449,445 A | * | 9/1995 | Shinneman | C23C 14/3407 204/298.09 |
| 5,976,334 A | | 11/1999 | Fu et al. | |
| 6,342,139 B1 | | 1/2002 | Aokura et al. | |
| 6,447,636 B1 | | 9/2002 | Qian et al. | |

(Continued)

FOREIGN PATENT DOCUMENTS

| | | |
|---|---|---|
| EP | 0801416 A1 | 10/1997 |
| JP | H07501105 A | 2/1995 |

(Continued)

OTHER PUBLICATIONS

PCT International Search Report dated May 29, 2015 for International Application No. PCT/US2015/016060.

(Continued)

*Primary Examiner* — Rodney G McDonald
(74) *Attorney, Agent, or Firm* — Patterson + Sheridan, LLP

(57) ABSTRACT

A process chamber includes a chamber body having a chamber lid assembly disposed thereon, one or more monitoring devices coupled to the chamber lid assembly, and one or more antennas disposed adjacent to the chamber lid assembly that are in communication with the one or more monitoring devices.

20 Claims, 4 Drawing Sheets

(56) References Cited

U.S. PATENT DOCUMENTS

| | | | |
|---|---|---|---|
| 6,917,291 B2* | 7/2005 | Allen | G06K 7/0008 340/10.1 |
| 7,298,268 B2* | 11/2007 | Zimmerman | G06K 7/0008 340/5.26 |
| 7,901,552 B2 | 3/2011 | Pavloff | |
| 2002/0041160 A1 | 4/2002 | Barnes et al. | |
| 2004/0050690 A1* | 3/2004 | Green | H01J 37/3455 204/192.13 |
| 2004/0128014 A1 | 7/2004 | Klekotka | |
| 2005/0236266 A1 | 10/2005 | Poole et al. | |
| 2008/0221721 A1 | 9/2008 | Reed et al. | |
| 2008/0230866 A1* | 9/2008 | Kulp | H01L 21/67248 257/467 |
| 2008/0308416 A1 | 12/2008 | Allen et al. | |
| 2009/0090620 A1* | 4/2009 | Pavloff | C23C 14/3407 204/298.13 |
| 2014/0246310 A1* | 9/2014 | Crowley | H01J 37/3455 204/298.03 |

FOREIGN PATENT DOCUMENTS

| | | |
|---|---|---|
| JP | 200859989 A | 3/2008 |
| WO | 9310276 A1 | 5/1993 |

OTHER PUBLICATIONS

European Search Report for Application No. EP15762097.2 dated Jul. 25, 2017.

* cited by examiner

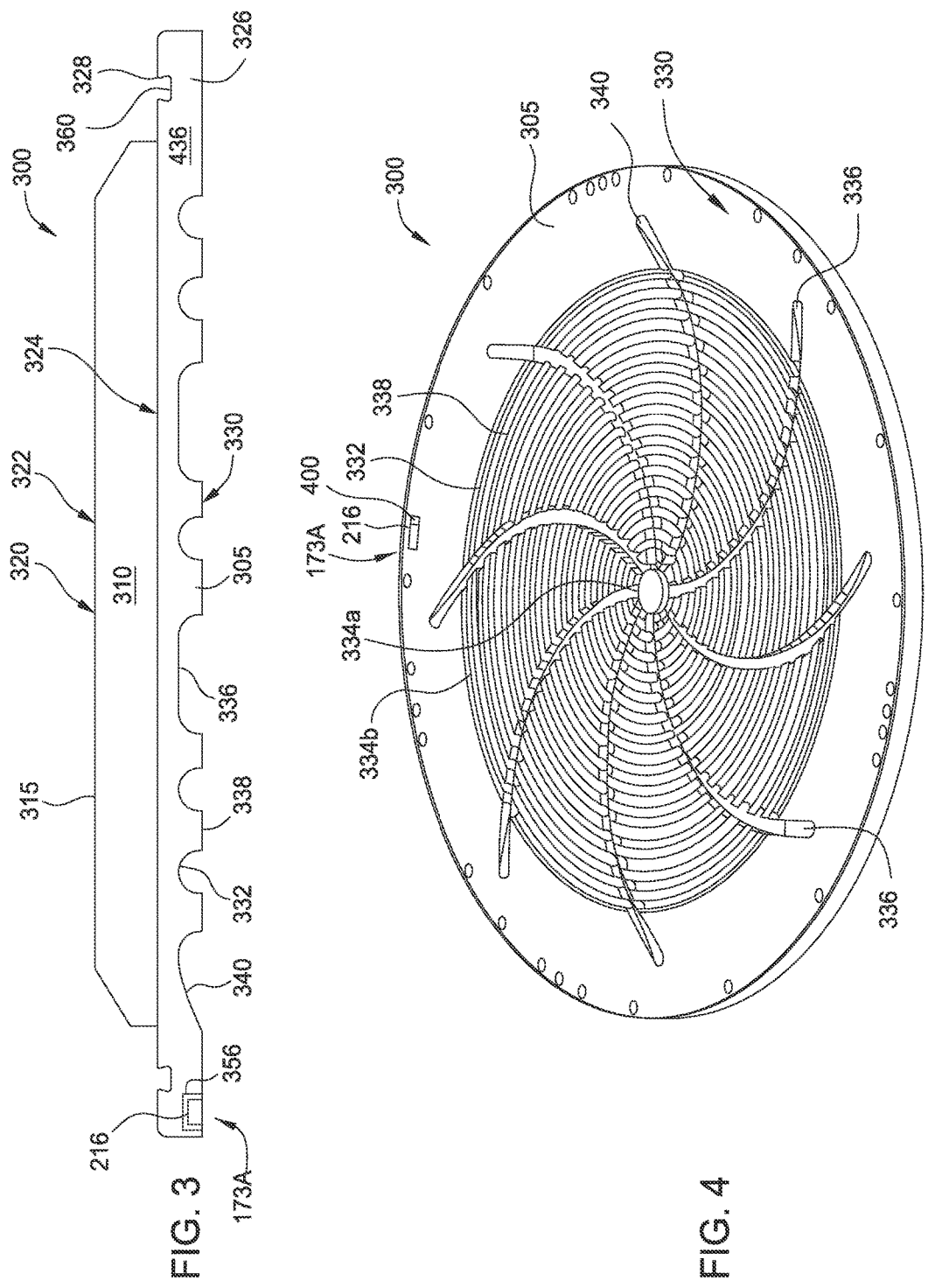

US 10,153,143 B2

SMART CHAMBER AND SMART CHAMBER COMPONENTS

CROSS-REFERENCE TO RELATED APPLICATIONS

This application claims benefit of U.S. Provisional Patent Application Ser. No. 61/953,428, filed Mar. 14, 2014, and U.S. Provisional Patent Application Ser. No. 61/954,458, filed Mar. 17, 2014. Both of the aforementioned provisional patent applications are hereby incorporated by reference herein.

BACKGROUND

Field

Embodiments of the disclosure relate to chamber having capabilities for monitoring components in or on the chamber as well as processes performed therein. More particularly, to a chamber and/or chamber components having one or more integral monitoring devices with transmitting/receiving capabilities.

Description of the Related Art

In the fabrication of electronic devices, many thermal processes are performed in processing chambers having consumable components and/or components that eventually need replacement after a number of cycles. Components utilized in these thermal processes such as etching, plasma enhanced chemical vapor deposition (PECVD), physical vapor deposition (PVD), and annealing, among other thermal processes, require diligent monitoring to assure satisfactory and safe operation. Additionally, many of the consumables are limited by specific criteria to provide efficient and/or safe use in the chamber and provide satisfactory results of the final product. In one example, some PVD processes use a sputtering target to sputter deposit material onto a substrate in the fabrication of integrated circuits and displays. Electromagnetic energy is applied to the sputtering target to facilitate sputtering of material from the sputtering target and onto a substrate to form a thin film thereon.

However, some sputtering targets are rated for a specific power application that may differ from a power application the chamber may be capable of delivering. For example, the chamber may be capable of delivering a high power to the sputtering target, but a specific sputtering target may be rated for a power application that is much less than the capability of the chamber in order to enable safe operation and satisfactory deposition on a substrate. If a user utilizes a power greater than the rating for the sputtering target, suitable deposition on the substrate may not be obtained. Additionally, the power delivered to the sputtering target may damage the sputtering target. The mismatch between the rated power application for a specific sputtering target and capability of the chamber may be extended to other consumable components of the chamber and/or processes performed therein.

Thus, there is a need for a chamber and/or chamber component that includes the capability of providing a metric of monitoring, identification and/or control of the component or processes performed in the chamber.

SUMMARY

Embodiments disclosed herein relate to a process chamber having one or more monitoring devices. The monitoring devices may include identification information for various components of the process chamber, among other data or information.

In one embodiment, a process chamber is provided. The process chamber includes a chamber body having a chamber lid assembly disposed thereon, one or more monitoring devices coupled to the chamber lid assembly, and one or more antennas disposed adjacent to the chamber lid assembly that are in communication with the one or more monitoring devices.

In another embodiment, a sputtering target for a sputtering chamber is provided. The sputtering target includes a backing plate having a frontside surface and a backside surface, the backside surface having a plurality of circular grooves which are spaced apart from one another, and at least one arcuate channel cutting through the circular grooves, and a monitoring device. The sputtering target also includes a sputtering plate mounted on the frontside surface of the backing plate.

In another embodiment, a magnetron is provided. The magnetron includes a magnet, a counterweight position adjacent to the magnet, and a monitoring device coupled to a metallic component of the magnetron.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a sectional side view of one embodiment of a sputtering target comprising a sputtering plate mounted on a backing plate.

FIG. 4 is a perspective view of the backside surface of the backing plate.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
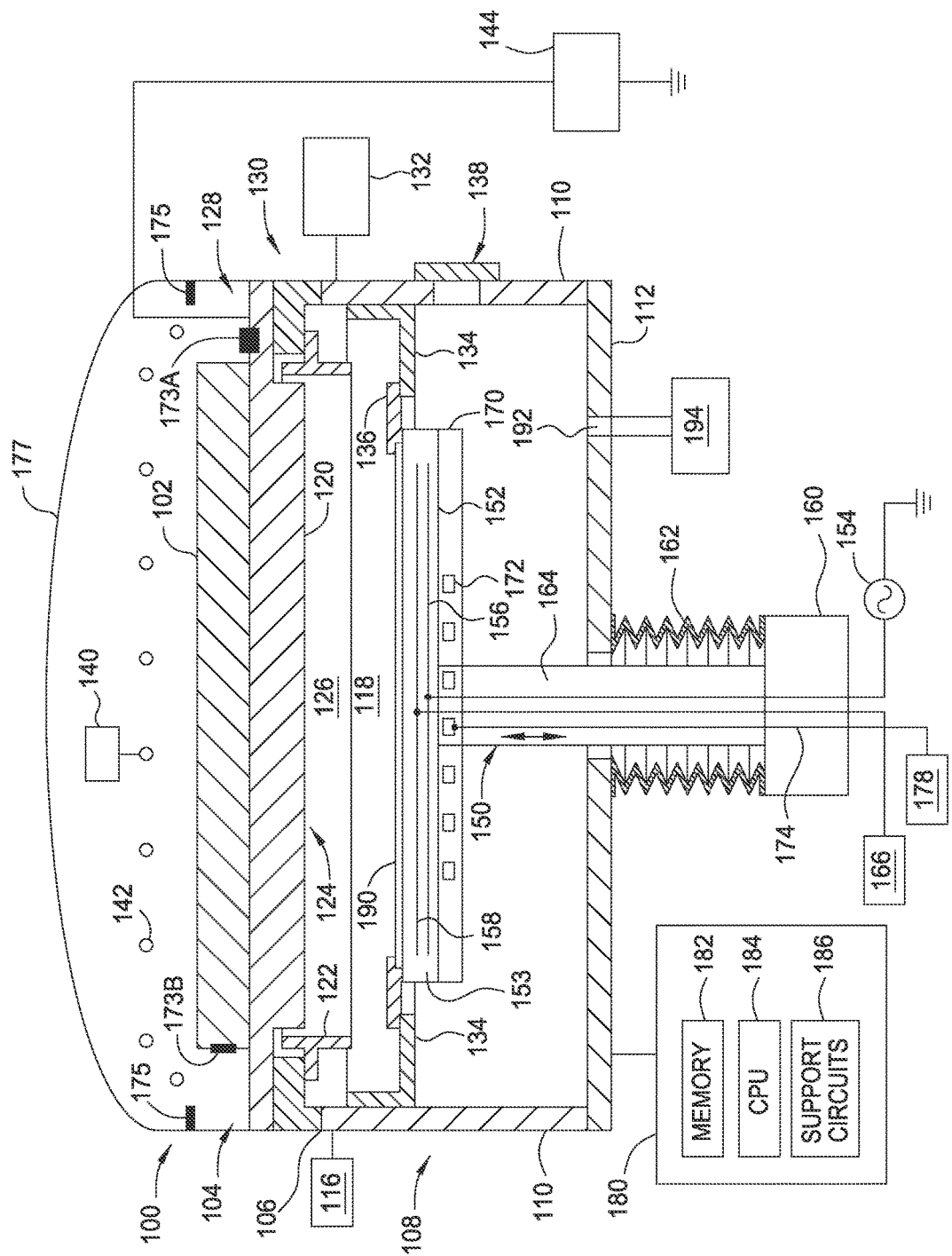
FIG. 1 is a cross sectional view of a process chamber according to one embodiment.

FIG. 1 illustrates an exemplary process chamber 100 (e.g., a physical vapor deposition (PVD) or sputter process chamber, or a chemical deposition chamber (CVD)). The process chamber 100 may be a PVD chamber suitable for sputter deposition of aluminum nitride (AlN) materials on a substrate 190, for example during the fabrication of MEMS. However, it should be appreciated that the process chamber 100 may be a CVD chamber or other chamber suitable for thermal processing of substrates.

The process chamber 100 includes a chamber body 108 having a processing volume 118 defined therein. The chamber body 108 has sidewalls 110 and a bottom 112. The dimensions of the chamber body 108 and related components of the process chamber 100 are not limited and generally are proportionally larger than the size of the substrate 190 to be processed therein. However, as any suitable substrate size may be processed, the process chamber 100 may be sized accordingly. Examples of suitable substrate sizes include substrate having a 200 mm diameter, a 300 mm diameter or a 450 mm diameter.

A chamber lid assembly 104 is mounted on the top of the chamber body 108. The chamber body 108 may be fabricated from stainless steel, aluminum, or other suitable materials. A substrate access port 138 is formed through the sidewall 110 of the chamber body 108, facilitating the transfer of a substrate 190 into and out of the process chamber 100. The access port 138 may be coupled to a transfer chamber and/or other chambers of a substrate processing system.

A substrate support 150 is disposed inside the chamber body 108. The substrate support 150 may be movable to control the spacing between the top of the substrate support 150 and the chamber lid assembly 104. In one embodiment, the substrate support 150 comprises an electrostatic chuck (ESC) 152.

A gas source 132 is coupled to the chamber body 108 to supply process gases into the processing volume 118. In one embodiment, process gases may include inert gases, non-reactive gases, and reactive gases if necessary. Examples of process gases that may be provided by the gas source 132 include, but not limited to, argon gas (Ar), helium (He), neon gas (Ne), krypton (Kr), xenon (Xe), nitrogen gas ($N_2$), oxygen gas ($O_2$), hydrogen gas ($H_2$), ammonia ($NH_3$), methane ($CH_4$), carbon monoxide (CO), and/or carbon dioxide ($CO_2$), among others. In one embodiment, the gas source 132 supplies $N_2$ and Ar into the chamber volume.

After the process gas is introduced into the process chamber 100, the gas is energized to form plasma. A process antenna 142, such as one or more inductor coils, may be provided adjacent to the process chamber 100. An antenna power supply 140 may power the process antenna 142 to inductively couple energy, such as radio frequency (RF) energy, to the process gas to form plasma. The plasma may be formed in a process zone defined in the process chamber 100 between the substrate support 150 and the lid assembly 104. Alternatively, or additionally, process electrodes comprising a cathode below the substrate 190 and an anode above the substrate 190 may be used to couple RF power to generate plasma. A controller 180 that also controls the operation of other components in the process chamber 100 may control the operation of the antenna power supply 140.

The lid assembly 104 generally includes a target 120 and a ground shield assembly 130 coupled thereto. The target 120 provides a material source that can be sputtered and deposited onto the surface of the substrate 190 during a PVD process. The target 120 may serve as the cathode of the plasma circuit during DC sputtering. The lid assembly 104 may further comprise a magnetron 102 mounted above the target 120 which enhances efficient sputtering materials from the target 120 during processing. The magnetron 102 allows easy and fast process control, as well as tailored film properties, while ensuring consistent target erosion and uniform deposition of a film, such as AlN, across the substrate 190. Examples of the magnetron assembly include a linear magnetron, a serpentine magnetron, a spiral magnetron, a double-digitated magnetron, a rectangularized spiral magnetron, among others.

The process chamber 100 also includes monitoring devices, such as a monitoring device 173A coupled to the target 120 and a monitoring device 173B coupled to the magnetron 102. Each of the monitoring devices 173A, 173B may be a radio frequency identification (RFID) chip with the capability to store data, transmit data to, and/or receive data from, the controller 180 via one or more antennas 175. The monitoring devices 173A, 173B may transmit instructions to the controller 180 including, but not limited to, data relating to process recipe, gas flow in the chamber 100, power application parameters and timing, pressure parameters during processing, rotation parameters for the magnetron 102, among other instructions. The monitoring devices 173A, 173B may also be capable of receiving process information from the controller 180. The information received from the controller 180 may be stored in the monitoring devices 173A, 173B. Alternatively, each of the monitoring devices 173A, 173B may be a barcode readable by a scanner. Each of the monitoring devices 173A, 173B may include a controller and a memory that is capable of at least read/write operations. The one or more antennas 175 may be dedicated to each of the monitoring devices 173A, 173B, or shared with each of the monitoring devices 173A, 173B. The antennas 175 may be directly coupled to the inside surface of a cover 177, or disposed on a shelf (not shown) that is coupled to the inside surface of the cover 177. As a safety and security enhancement, the data contained within the monitoring devices 173A, 173B may be encrypted by proprietary means. The application and benefit of encryption is to further authenticate and verify the contents of the data within the monitoring devices 173A, 173B. The data may include information such as: serial number or other identifier for the component, date of manufacture of the component, first date in service for the component, process hours of the component, and any other data that can be used to predict a safe service life for the component and its expiration.

The monitoring devices 173A, 173B may operate at a frequency that is different than the frequencies utilized in the chamber 100. The frequency of the monitoring devices 173A, 173B may comprise a first or high frequency range, such as the ultra-high frequency (UHF) range while the chamber 100 is capable of operating in a second frequency range that is less than the first frequency range, such as the high frequency (HF) range or the very high frequency (VHF) range. In one example, the monitoring devices 173A, 173B may be operable in a range of about 840-930 MHz while the chamber 100 operates at frequencies of about 400 KHz (DC, pulsed DC) or in the 13 MHz range (RF bias). Thus, the different frequencies allow operation of the monitoring devices 173A, 173B without interference from the operation of the chamber 100. It may not be necessary to read and/or write to/from the monitoring devices 173A, 173B continuously. For example, in one embodiment, reading and/or writing to/from the monitoring devices 173A, 173B may be performed in between substrate processing periods. During these periods when the chamber is not processing a substrate, the monitoring devices 173A, 173B may be queried to check and/or confirm that respective components are fully operational, and write back results to the monitoring devices 173A, 173B.

In one example, after a substrate is processed, the monitoring devices 173A, 173B may be queried, and the monitoring devices 173A, 173B may updated by a write back of results of clocks and counters after the substrate is processed. The query may also confirm that all is operational, and another substrate may be readied for processing. Additionally, during this query/read/write period, substrate transfer processes may be performed such that no significant chamber downtime is incurred, and throughput is not affected. A pumping port 192 is formed through the bottom 112 of the chamber body 108. A pumping device 194 is coupled to the processing volume 118 to evacuate and control the pressure therein.

The target 120 (or target plate) may be fabricated from a material utilized for the deposition layer, or elements of the deposition layer to be formed in the process chamber 100. A high voltage power supply, such as a power source 144, is connected to the target 120 to facilitate sputtering materials from the target 120. The target 120 may be fabricated from a material containing silicon (Si), titanium (Ti) metal, tantalum metal (Ta), hafnium (Hf), tungsten (W) metal, cobalt (Co), nickel (Ni), copper (Cu), aluminum (Al), alloys thereof, combinations thereof, or the like. Additionally, the electron emission from the target during processing may be controlled by n-type or p-type doping of the target. The target 120 may be doped with a conducting element such as boron (B). In one embodiment, the target 120 may include an Al alloy for generating Al ions which combine with the nitrogen ions on the substrate 190 to form an AlN layer.

The target 120 generally includes a peripheral portion 128 and a central portion 124. The peripheral portion 128 is disposed over the sidewalls 110 of the chamber. The central portion 124 of the target 120 may have a curvature slightly extending towards the surface of the substrate 190 disposed on the substrate support 150. The spacing between the target 120 and the substrate support 150 may be maintained between about 50 mm and about 150 mm. It is noted that the dimension, shape, materials, configuration and diameter of the target 120 may be varied for specific process or substrate requirements. The target 120 may also include adjacent tiles or segmented materials that together form the target.

The ground shield assembly 130 of the lid assembly 104 includes a ground frame 106 and a ground shield 122. The ground frame 106 may electrically insulate the target 120 from other components of the process chamber 100. The ground shield assembly 130 may also include other chamber shield member, target shield member, dark space shield, and dark space shield frame. The ground shield 122 is coupled to the peripheral portion 128 by the ground frame 106 defining an upper processing region 126 below the central portion of the target 120 in the processing volume 118. The ground frame 106 electrically insulates the ground shield 122 from the target 120 while providing a ground path to the chamber body 108 of the process chamber 100 through the sidewalls 110. The ground shield 122 constrains plasma generated during processing within the upper processing region 126 and dislodges target source material from the confined central portion 124 of the target 120, thereby allowing the dislodged target source to be mainly deposited on the substrate surface rather than chamber sidewalls 110. In one embodiment, the ground shield 122 may be formed by one or more work-piece fragments and/or a number of these pieces bonding by processes known in the art, such as welding, gluing, high pressure compression, etc.

The controller 180 is coupled to the process chamber 100. The controller 180 includes a central processing unit (CPU) 184, a memory 182, and support circuits 186. The controller 180 is utilized to control the process sequence, regulating the gas flows from the gas source 132 into the process chamber 100 and controlling ion bombardment of the target 120. The CPU 184 may be of any form of a general purpose computer processor that can be used in an industrial setting. The software routines can be stored in the memory 182, such as random access memory, read only memory, floppy or hard disk drive, or other form of digital storage. The support circuits 186 are conventionally coupled to the CPU 184 and may comprise cache, clock circuits, input/output subsystems, power supplies, and the like. The software routines, when executed by the CPU 184, transform the CPU into a specific purpose computer (controller) 180 that controls the process chamber 100 such that the processes are performed in accordance with the present disclosure. The software routines may also be stored and/or executed by a second controller (not shown) that is located remotely from the process chamber 100. The software routines may also be modified by data received from the monitoring devices 173A and/or 173B.

During processing, material is sputtered from the target 120 and deposited on the surface of the substrate 190. The target 120 and the substrate support 150 are biased relative to each other, and/or relative to ground, by the power source 144 to maintain a plasma formed from the process gases supplied by the gas source 132. The ions from the plasma are accelerated toward and strike the target 120, causing target material to be dislodged from the target 120. The dislodged target material and reactive process gases together form a layer on the substrate 190 with desired compositions. RF, DC or fast switching pulsed DC power supplies, or combinations thereof, provide tunable target bias for precise control of sputtering composition and deposition rates for the sputtered material.

A shaft 164 extending through the bottom 112 of the chamber body 108 couples to a lift mechanism 160. The lift mechanism 160 is configured to move the substrate support 150 between a lower transfer position and an upper processing position. A bellows 162 circumscribes the shaft 164 and coupled to the substrate support 150 to provide a flexible seal there between, thereby maintaining vacuum integrity of the processing volume 118 for the process chamber 100.

As discussed above, the substrate support 150 contain the electrostatic chuck (ESC) having a chuck electrode 158. The ESC 152 uses the attraction of opposite charges to hold both dielectric and conductive substrates 190 during processing and is powered by DC power supply 166. The ESC 152 comprises the chuck electrode 158 embedded within a dielectric body 153. The DC power supply 166 may provide a DC chucking voltage of about 200 to about 2000 volts to the chuck electrode 158. The DC power supply 166 may also include a system controller 180 for controlling the operation of the chuck electrode 158 by directing a DC current to the electrode for chucking and de-chucking the substrate 190.

In some embodiments, a bias to the substrate 190 during different phases of the layer deposition process. Therefore, a bias may be provided to a bias electrode 156 (or chuck electrode 158) in the substrate support 150 from a source 154 (e.g., DC and/or RF source), so that the substrate 190 will be bombarded with ions formed in the plasma during one or more phase of the deposition process.

A shadow frame 136 is disposed on the periphery region of the substrate support 150 and is configured to confine deposition of source material sputtered from the target 120 to a desired portion of the substrate surface. A chamber shield 134 may be disposed on the inner wall of the chamber body 108 and have a lip extending inward to the processing volume 118 configured to support the shadow frame 136 disposed around the substrate support 150. As the substrate support 150 is raised to the upper position for processing, an outer edge of the substrate 190, disposed on the substrate support 150, is engaged by the shadow frame 136 and the shadow frame 136 is lifted up and spaced away from the chamber shield 134. When the substrate support 150 is lowered to the transfer position adjacent to the substrate transfer access port 138, the shadow frame 136 is set back on the chamber shield 134. Lift pins (not shown) are selectively moved through the substrate support 150 to lift the substrate 190 above the substrate support 150 to facilitate access to the substrate 190 by a transfer robot or other suitable transfer mechanism.

Figure 2:
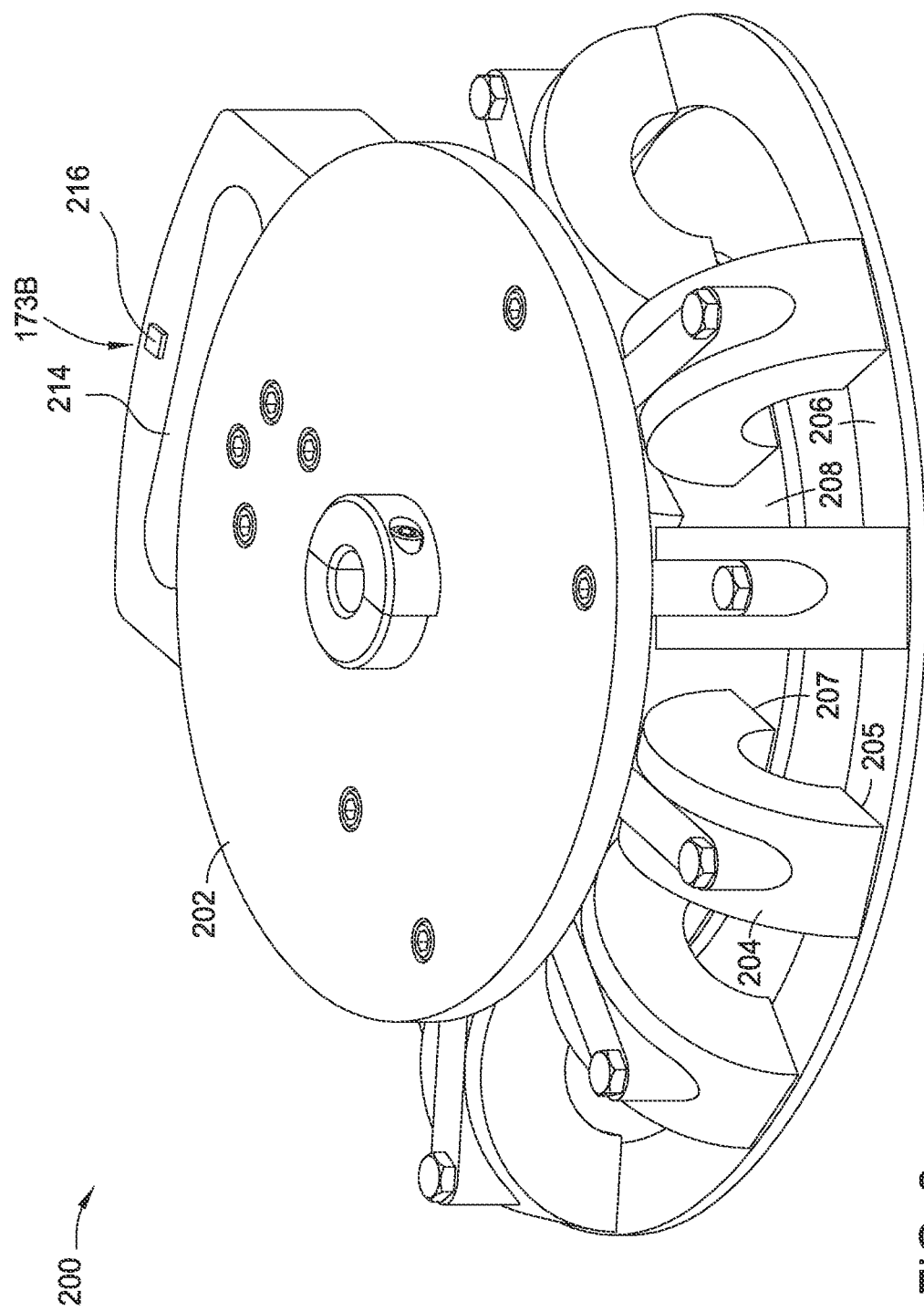
FIG. 2 is an orthographic view of a magnetron according to one embodiment.

FIG. 2 is an orthographic view of a magnetron 200 according to one embodiment. The magnetron 200 may be usable in the chamber 100 of FIG. 1. The magnetron 200 includes a support plate 202, a plurality of U shaped magnets 204, a first magnetic pole piece 206 and a second magnetic pole piece 208. The support plate 202 may be made of brass, and the magnetic pole pieces may be made of stainless steel. The first magnetic pole piece 206 may be a loop, and one end of each of the U magnets 205 is disposed thereon. The second magnetic pole piece 208 may be a plate, and the other end of each of the U magnets 205 is disposed thereon. The magnetic pole pieces 206, 208 may be coplanar. In one embodiment, the magnets are made of or comprise cylindrical magnets where the main top plate is magnetic SST (410 alloy) and the bottom pole pieces are also made of 410.

As shown in FIG. 2, a monitoring device 173B is shown positioned at a perimeter of the magnetron 200. The monitoring device 173B may be coupled to a metallic member of the magnetron 200, such as a counterweight 214. In one embodiment, the monitoring device 173B is an RFID tag 216. The RFID tag 216 may be covered, coated with a ceramic material, or otherwise include a housing that is made of a ceramic material. Potential mounting methods for installing the RFID tag 216 onto the counterweight 214 include epoxy potting, a screwed-in housing, a cover that fastens to the counterweight 214, spring clips, and the like. Alternate monitoring devices are also potentially applicable. For instance, a stick-on RFID tag 216 or barcode tag may be used as well. In one embodiment, the backside of the RFID tag 216 contacts or is in very close proximity to a metal backplane to enhance the readability through the antenna 175 (shown in FIG. 1). Additionally, a spacing of about 1 mm to about 5 mm may surround the RFID tag 216 in order to enhance the readability through the antenna 175 (shown in FIG. 1).

The position of the monitoring device 173B on the periphery of the magnetron 200 minimizes interference from a magnetic field produced by the magnetron 200. Additionally, the positioning of the monitoring device 173B on the top side of the magnetron 200 as shown in FIG. 2 places the monitoring device 173B in closer proximity to the antenna 175 (shown in FIG. 1).

FIGS. 3-6 are various views of an exemplary embodiment of a sputtering target 300. The target 300 may be usable in the chamber 100 of FIG. 1 to deposit sputtered material on a substrate with reduced erosion groove and microcracking. Referring to FIG. 3, in one embodiment, the sputtering target 300 comprises a backing plate 305 and a sputtering plate 310. The sputtering plate 310 and backing plate 305 can be a monolith comprising a single structure made from the same high-purity material and that serves as both a backing plate and a sputtering plate or they may be separate structures that are bonded together to form a sputtering target. The sputtering plate 310 comprises a central cylindrical mesa 315 that serves as a sputtering surface 320, and which has a top plane 322 that is maintained parallel to the plane of a substrate 190 (shown in FIG. 1) during use of the target 300 in the chamber 100 of FIG. 1. The sputtering plate 310 is made from a metal or metal compound. For example, the sputtering plate 310 can be composed of, for example aluminum, copper, cobalt, nickel, tantalum, titanium, tungsten and alloys thereof. The sputtering plate 310 can also be a metal compound, such as for example, tantalum nitride, tungsten nitride or titanium nitride. In one version, the sputtering plate 310 comprises titanium at a high purity level, for example, at least about 99.9%, or even at least about 99.99%. Additionally, dielectric materials like LiCo, LiPON, LiPON(B) Vanadium Oxide (VOX) may be used for the material of the sputtering plate 310.

In one version, the sputtering plate 310 is mounted on the backing plate 305. The backing plate 305 may be a separate structure which has a front surface 324 to support the sputtering plate 310 and an annular flange 326 that extends beyond the radius of the sputtering plate 310. The annular flange 326 comprises a peripheral circular surface and has an outer flange 328 that rests on the ground frame 106 shown in the chamber 100 of FIG. 1. The ground frame 106 electrically isolates and separates the backing plate 305 from the chamber 100, and is typically a ring made from a ceramic material, such as aluminum oxide.

The backing plate 305 is made from a material selected to have a high thermal conductivity and to circulate a heat transfer fluid therein. A suitably high thermal conductivity of the backing plate 305 is at least about 200 W/mK, for example, from about 220 to about 400 W/mK. Such thermal conductivity levels allow the target 300 to be operated for longer process time periods by efficiently dissipating the heat generated in the target 300. In one version, the backing plate 305 is made from a metal, such as copper or aluminum. In another version, the backing plate 305 comprises a metal alloy, such as for example copper-zinc (naval brass), or chromium-copper alloy. In one exemplary embodiment the backing plate 305 comprises C18000 which is an alloy having component weights of Cr (0.8%), Cu (96.1%), Ni (2.5%) and Si (0.6%). The backing plate 305 can also be a separate structure containing one or more bonded plates. The backing plate 305 may be flat or dished.

The backing plate 305 can also have an electrical resistivity that is in a desirable range to reduce erosion grooving while still allowing operation of the target 300 for an extended time period. The electrical resistivity should be sufficiently low to allow the target 300 to be electrically biased or charged during sputtering. However, the electrical resistivity should also be sufficiently high to reduce the effect of eddy currents in the target 300, as the heat generated by the eddy current as it travels along a pathway through the target 300 is proportional to the electrical resistance encountered along the pathway. In one version, the electrical resistivity of the backing plate 305 is from about 2 to about 5 micro ohms centimeter (μohm cm) or even from about 2.2 to about 4.1 μohm cm.

An exemplary backing plate 305 is made from a metal alloy comprising copper-chrome. The resistivity of copper-chrome does not change until its temperatures exceed 600 degrees C., which is sufficiently high to exceed normal sputtering process temperatures. In one version, the copper-chrome alloy comprises a ratio of copper to chrome of from about 80:1 to about 165:1. The copper-chrome alloy comprises copper in a wt % of from about 98.5 to about 99.1 wt %, and chrome in a wt % of from about 0.6 to about 1.2 wt %. The copper-chrome alloy has a thermal conductivity of about 340 W/mK and an electrical resistivity of about 2.2 μohm cm.

In one embodiment, the backing plate 305 comprises a backside surface 330 that opposes the front surface 324. The backside surface 330 has a concentric pattern of circular grooves 332 (or grooves 334a and 334b) and intersecting arcuate channels 336. The circular grooves 332 may be separated by ridges 338. The intersecting arcuate channels 336 cut through the circular grooves 332 at angles ranging from 60 to 90 degrees relative to the localized horizontal tangent to the groove 332 at the point of intersection. The intersecting grooves break up the continuous trench structure of the circular grooves 332 to allow a heat transfer fluid to circulate between grooves 332 at the intersection points. The intersecting arcuate channels 336 have been found to significantly reduce stagnation of a heat transfer fluid within the continuous trench structures of the circular grooves 332.

The sputtering target 300 includes a monitoring device 173A as shown in FIGS. 3 and 4. In one embodiment, the monitoring device 173A is an RFID tag 216. In one implementation, the RFID tag 216 is disposed in a pocket 356 formed in a periphery of the annular flange 326 of the backing plate 305. The pocket 356 may be sized greater than the dimensions of the RFID tag 216 such that a spacing of about 1 mm to about 5 mm may surround the RFID tag 216 in order to enhance the readability through the antenna 175 (shown in FIG. 1). The RFID tag 216 may be mounted onto the metallic material of backing plate 305 within the pocket 356. The spacing of the RFID tag 216 away from the metallic material within the pocket 356 enhances functionality of the RFID tag 216. The RFID tag 216 may be covered, coated with a ceramic material, or otherwise include a housing that is made of a ceramic material. Potential mounting methods for installing the RFID tag 216 onto the annular flange 326 of the backing plate 305 include epoxy potting, a screwed-in housing, a cover that screws in, spring clips, and the like. A stick-on RFID tag 216 or barcode tag may be used as well. In one embodiment, the backside of the RFID tag 216 contacts or is in very close proximity to a metal backplane to enhance the readability through the antenna 175 (shown in FIG. 1).

The position of the monitoring device 173A on the periphery of the sputtering target 300 may minimize interference from an electromagnetic field. Additionally, the positioning of the monitoring device 173A on the top side of the sputtering target 300 as shown in FIG. 4 places the monitoring device 173A in closer proximity to the antenna 175 (shown in FIG. 1).

Figure 6:
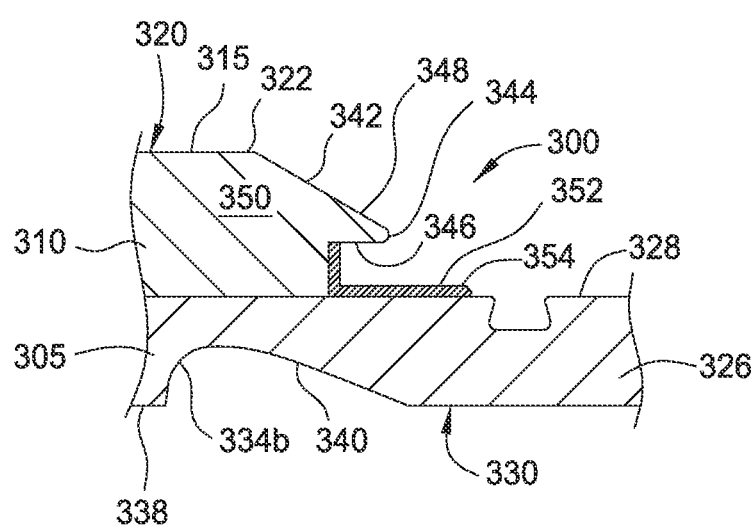
FIG. 6 is a sectional side view of the profile of the peripheral edge of the sputtering target.

Referring again to the backside surface 330, the arcuate channels 336 also can have a curved tip region 340 that tapers upward to the backside surface 330 of the backing plate 305, as shown in FIGS. 3 and 6. The curved tip region 340 begins at about the radius of the outer circular groove 334b.

The grooves 332 and channels 336 can be formed by machining the preformed backing plate 305, for example, cutting by a lathe or milling. The corners of the grooves 332 and resultant ridges 338 can also be rounded in the machining process, to reduce erosion and stress concentration at the corners.

In one version, the sputtering surface 320 of the sputtering plate is profiled to reduce flaking of process deposits as shown in FIGS. 3-6. In an exemplary embodiment, a peripheral inclined rim 342 surrounds the top plane 322 of the sputtering surface 320. The inclined rim 342 is inclined relative to the plane 322 of the sputtering surface 320 by an angle of at least about 8 degrees, for example, from about 10 degrees to about 20 degrees, or even about 15 degrees. An arcuate lip 348 is positioned around the inclined rim 342 and comprises a curved portion that extends outward and upward from the inclined rim 342. The curved portion terminates in an inward ledge 346 that is substantially parallel to the plane of the sputtering surface 320 and which extends inward from a peripheral edge 344 of the lip 348. The inward ledge 346 connects to a cylindrical recessed sidewall 350 that is recessed inward from the peripheral edge 344 of the arcuate lip 348. The inward ledge 346 also provides a surface to catch falling process deposits that flake off of the recessed sidewall 350 while the target 300 is installed in the process chamber 100.

The recessed sidewall 350 is connected to the annular flange 326 of the backing plate 305. The annular flange 326 is substantially parallel to the plane of the sputtering surface 320 and comprises an outer flange 328. The outer flange 328 may rest on the ground frame 106 (shown in FIG. 1) and includes an o-ring groove 360 for sealing of fluids. Portions of the annular flange 326 and side surfaces of the target 300 can be coated with a protective coating 354 to provide better adhesion of sputtered material and to reduce flaking of the material from these surfaces.

Figure 5:
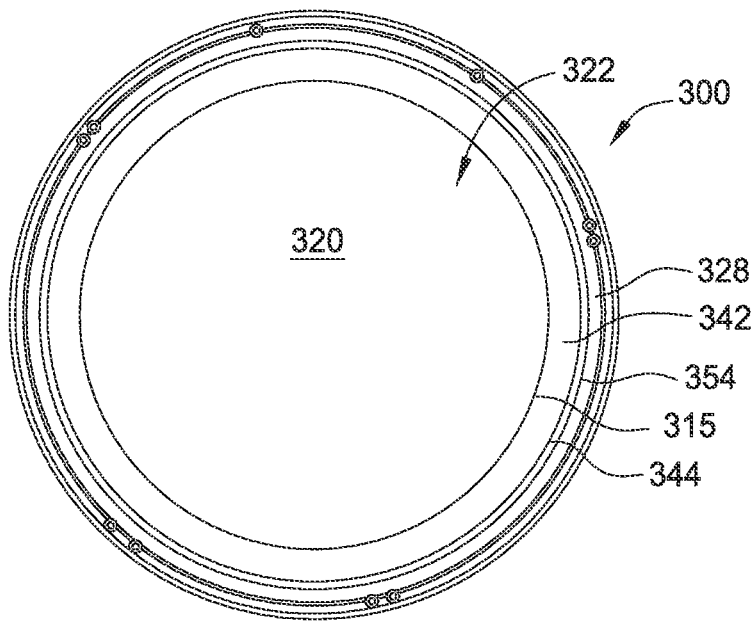
FIG. 5 is a top view of the front surface of the sputtering plate.

In one version the inner flange surface 352 and recessed sidewall 350 are coated with a protective coating 354, for example, a twin-wire arc sprayed aluminum coating as shown in FIGS. 4 and 5. Before coating, the inner flange surface 352 and recessed sidewall 350 are degreased and ground with a silicon carbide disc to achieve a roughness of 200 to 300 micro-inches. The coating 354 extends to cover the recessed sidewall 350 of the sputtering plate 310 and the inner flange surface 352 of the backing plate 305. The coating 354 has a final surface roughness of from about 500 to about 900 micro-inches, and a thickness of from about 5 to about 10 mils. The coating 354 protects the edges of the target 300 and provides better adhesion of the sputtered material to these surfaces.

Embodiments, described herein provide an identification device in the form of monitoring devices 173A, 173B that may be attached to or embedded within a body of a target 120 or a magnetron 102. The monitoring devices 173A, 173B may comprise a barcode or other form of unique visual identification. The monitoring devices 173A, 173B may comprise a uniquely identified radio frequency device or other electronic tag device. The monitoring devices 173A, 173B may comprise a non-volatile memory 400 (shown in FIG. 4).

The non-volatile memory may comprise bits that are utilized to store information about the target 120 or the magnetron 102. The information may include one or both of fixed and variable data uniquely identifying and/or including the process limits of the target 120 or the magnetron 102. The information may further include date of manufacture, first date in service, time in active process, cumulative hours of RF energy and/or process gas volumes. The information may further include predictive end-of-life limits for the target 120 and the magnetron 102. The limits may be defined and may be compared to other data within the device (which may include historical data) or other data (which may include historical data) stored externally. The data in the monitoring devices 173A, 173B may be encrypted to prevent tampering and/or unauthorized viewing.

The process chamber 100 may use the data within the monitoring devices 173A, 173B to establish safe operating limits for the components and/or the process chamber 100. The safe operating limits, include, but are not limited to, maximum RF power, compatible processes and process materials, compatible processing tools, and other information that may be used to enhance tool and operator safety, as well as process uniformity.

Embodiments described herein include an RFID reader module to a processing system mainframe capable of, in one embodiment, reading up to 4 independent antennas 175. Each antenna 175 may be positioned above the periphery of the PVD chamber source (lid) such that each antenna 175 is able to send and receive data from the monitoring device 173B installed into the rim of the target 120 and also the monitoring device 173A located on the rotating magnetron 102. The software in the controller 180 may read the monitoring device 173A in the target 120 prior to or after each deposition, or at any time the system has been halted. Similarly, the monitoring device 173B may be read by the software of the controller 180 prior to or after each deposition, or at any time the system has been halted.

Information may be both read from the monitoring devices 173A, 173B and written back to the monitoring devices 173A, 173B at intervals to record usage of components that have a specified operational life. For example, the monitoring device 173A on the target 120 may record each deposition process and inform personnel (via a computer screen) to how many additional deposition processes are available. The monitoring devices 173A, 173B may also be used for identification purposes as well as include process recipe data and processing limits. For example, the power rating of the target 120 may be communicated to the controller 180 and instruct the controller 180 to limit power application to be within that rating.

Data, other than information such as part number and serial number, can be encrypted to eliminate the potential for inadvertent or intentional modification of the use limits. Detection, by the controller 180, of the approved components having the monitoring devices 173A, 173B can then be used to allow the application of the higher power deposition recipes that may be otherwise locked out to protect the chamber and/or substrates. For example, if components are not identified as approved for high power operation, the process chamber 100 may still be allowed to function, but only at power levels known to be acceptable for the identified components. Results of the use of RFID tags in a chamber have been proven in tests. As a safety and security enhancement, the data contained within the RFID chip may be encrypted by proprietary means.

While the foregoing is directed to embodiments of the disclosure, other and further embodiments of the disclosure may be devised without departing from the basic scope thereof, and the scope thereof is determined by the claims that follow.

The invention claimed is:

1. A process chamber, comprising:
a chamber body having a chamber lid assembly disposed thereon, the chamber body being operable at a first radio frequency range;
one or more monitoring devices coupled to the chamber lid assembly and containing encrypted data, each of the one or more monitoring devices being operable at a second radio frequency range that is different than the first radio frequency range; and
one or more antennas disposed adjacent to the chamber lid assembly and in communication with the one or more monitoring devices.

2. The process chamber of claim 1, wherein the one or more monitoring devices include identification information for components of the chamber lid assembly.

3. The process chamber of claim 2, wherein the identification information includes one or both of fixed data and variable data.

4. The process chamber of claim 2, wherein the identification information includes date of manufacture, first date in service, time in active process, cumulative hours of radio frequency application, and combinations thereof.

5. The process chamber of claim 2, wherein the identification information includes end of life limits.

6. The process chamber of claim 2, wherein the identification information includes operating parameters.

7. The process chamber of claim 1, wherein each of the one or more monitoring devices comprises a radio frequency identification device.

8. The process chamber of claim 1, wherein each of the one or more monitoring devices comprises a memory.

9. The process chamber of claim 1, wherein the chamber lid assembly includes a magnetron and a sputtering target.

10. A sputtering target for a sputtering chamber, the sputtering target comprising:
a backing plate having a frontside surface and a backside surface, the backside surface having:
a plurality of circular grooves which are spaced apart from one another; and
at least one arcuate channel cutting through the circular grooves;
a monitoring device containing encrypted data and positioned on the backside surface of the backing plate, the monitoring device being operable at a first radio frequency range; and
a sputtering plate mounted on the frontside surface of the backing plate, the sputtering chamber being operable at a second radio frequency range that is different than the first radio frequency range.

11. The target of claim 10, wherein the monitoring device comprises a radio frequency identification tag.

12. The target of claim 10, wherein the monitoring device includes identification information for the target.

13. The target of claim 12, wherein the identification information includes one or both of fixed data and variable data.

14. The target of claim 12, wherein the identification information includes date of manufacture, first date in service, time in active process, cumulative hours of radio frequency application, or combinations thereof.

15. The target of claim 12, wherein the identification information includes end of life limits.

16. The target of claim 12, wherein the identification information includes operating parameters.

17. A magnetron, comprising:
a magnet disposed in a chamber, the chamber being operable at a first radio frequency range;
a counterweight positioned adjacent to the magnet; and
a monitoring device coupled to a metallic component of the magnetron, the monitoring device operable at a second radio frequency range that is different than the first radio frequency range.

18. The magnetron of claim 17, wherein the monitoring device includes identification information for the magnetron.

19. The magnetron of claim 18, wherein the identification information includes date of manufacture, first date in service, time in active process, cumulative hours of radio frequency application, or combinations thereof.

20. The magnetron of claim 18, wherein the identification information includes operating parameters.

* * * * *